(12) United States Patent
Tseng et al.

(10) Patent No.: US 7,276,417 B2
(45) Date of Patent: Oct. 2, 2007

(54) HYBRID STI STRESSOR WITH SELECTIVE RE-OXIDATION ANNEAL

(75) Inventors: Kai-Ting Tseng, Taichung (TW); Yu-Lien Huang, Jhubei (TW); Hao-Ming Lien, Hsinchu (TW); Ling-Yen Yeh, Hsinchu (TW); Hun-Jan Tao, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 11/320,221

(22) Filed: Dec. 28, 2005

(65) Prior Publication Data

US 2007/0148881 A1    Jun. 28, 2007

(51) Int. Cl.
*H01L 21/336* (2006.01)
(52) U.S. Cl. ................. 438/296; 438/221; 257/E21.546
(58) Field of Classification Search ................. 438/221, 438/275, 296, 424, 425
See application file for complete search history.

(56) References Cited

U.S. PATENT DOCUMENTS

| 6,037,018 | A  | * | 3/2000 | Jang et al. ................. 427/579 |
| 6,605,502 | B2 | * | 8/2003 | Iyer et al. ................. 438/225 |
| 2005/0064646 | A1 | * | 3/2005 | Chidambarrao et al. .... 438/221 |
| 2005/0179112 | A1 | * | 8/2005 | Belyansky et al. ......... 257/510 |
| 2005/0285150 | A1 | * | 12/2005 | Birner et al. ............... 257/213 |
| 2006/0019444 | A1 | * | 1/2006 | Lu et al. ................... 438/257 |
| 2006/0228851 | A1 | * | 10/2006 | Sadaka et al. ............. 438/221 |

OTHER PUBLICATIONS

Ortolland, C., et al., "Electrical Characterization and Mechanical Modeling of Process Induced Strain in 65 nm CMOS Technology," IEEE, 2004, pp. 137-140.
Ishibashi, M., et al., "Novel Shallow Trench Isolation Process from Viewpoint of Total Strain Process Design for 45 nm Node Devices and Beyond," Japanese Journal of Applied Physics, vol. 44, No. 48, 2005, pp. 2152-2156.
Sheu, Y. M., et al., "Impact of STI Mechanical Stress in Highly Scaled MOSFETs," IEEE, 2003, pp. 269-272.

* cited by examiner

*Primary Examiner*—Scott B. Geyer
*Assistant Examiner*—Reema Patel
(74) *Attorney, Agent, or Firm*—Slater & Matsil, L.L.P.

(57) ABSTRACT

A method for forming stressors in a semiconductor substrate is provided. The method includes providing a semiconductor substrate including a first device region and a second device region, forming shallow trench isolation (STI) regions with a high-shrinkage dielectric material in the first and the second device regions wherein the STI regions define a first active region in the first device region and a second active region in the second device region, forming an insulation mask over the STI region and the first active region in the first device region wherein the insulation mask does not extend over the second device region, and performing a stress-tuning treatment to the semiconductor substrate. The first active region and second active region have tensile stress and compressive stress respectively. An NMOS and a PMOS device are formed on the first and second active regions, respectively.

6 Claims, 6 Drawing Sheets

HYBRID STI STRESSOR WITH SELECTIVE RE-OXIDATION ANNEAL

TECHNICAL FIELD

This invention relates generally to metal-oxide-semiconductor (MOS) devices, and more particularly to MOS devices with stressed channel regions and fabrication methods for forming the same.

BACKGROUND

With integrated circuits becoming smaller and faster, improvement of device driving current is becoming more important. Device current is closely related to gate length, gate capacitance, and carrier mobility. Shortening poly-gate length, increasing gate capacitance, and increasing carrier mobility can improve the device current performance. Gate length reduction is an on-going effort coming with the effort to shrink circuit size. Increasing gate capacitance has also been achieved by efforts such as reducing the gate dielectric thickness, increasing the gate dielectric constant, and the like. In order to further improve device current, enhancing carrier mobility has also been explored.

Among efforts made to enhance carrier mobility, forming a stressed channel is a known practice. Stress can enhance bulk electron and hole mobility. The performance of a MOS device can be enhanced through a stressed-surface channel. This technique allows performance to be improved at a constant gate length, without adding complexity to circuit fabrication or design.

When silicon is placed under stress, the in-plane, room temperature electron mobility is dramatically increased. One way to develop stress is by using a graded SiGe epitaxy layer as a substrate on which a layer of relaxed SiGe is formed. A layer of silicon is formed on the relaxed SiGe layer. MOS devices are then formed on the silicon layer, which has inherent stress. Since the lattice constant of SiGe is larger than that of Si, the Si film is under biaxial tension and thus the carriers exhibit stress-enhanced mobility.

Stress in a device may have components in three directions: parallel to the MOS device channel length, parallel to the device channel width, and perpendicular to the channel plane. The stresses parallel to the device channel length and width are called in-plane stresses. Research has revealed that a bi-axial, in-plane tensile stress field can improve NMOS performance, and a compressive stress parallel to the channel length direction can improve PMOS device performance.

Stress can also be applied by forming a stressed capping layer, such as a contact etch stop (CES) layer, on a MOS device. When a stressed capping layer is deposited, due to the lattice spacing mismatch between the capping layer and the underlying layer, an in-plane stress develops to match the lattice spacing.

In further explorations, a local mechanical stress control technology has been reported to improve device performance by utilizing a high tensile sub-atmospheric material to form shallow trench isolation regions. After a post anneal process, stress is applied to active regions by shallow trench isolation regions. However, the stress improvement using this method is limited. All shallow trench isolation regions on a chip behave similarly in the post anneal process, thus applying a same type of stress to active regions on the chip. However, NMOS and PMOS devices demand different types of stresses. Improvement of the device performance on either NMOS or PMOS devices means degradation of the others.

Although multiple methods are effective in applying stress to channel regions of MOS devices, new methods, particularly methods for improving performance of both NMOS and PMOS device, are still demanded.

SUMMARY OF THE INVENTION

The preferred embodiment of the present invention provides a method for forming stressors in a semiconductor substrate.

In accordance with one aspect of the present invention, the method includes providing a semiconductor substrate comprising a first device region and a second device region, forming shallow trench isolation (STI) regions with a high-shrinkage dielectric material in the first and the second device regions wherein the STI regions define a first active region in the first device region and a second active region in the second device region, forming an insulation mask over the first device region wherein the insulation mask does not extend over the second device region, and performing a stress-tuning treatment to the semiconductor substrate. The resulting first active region and the second active region have tensile stress and compressive stress respectively. An NMOS and a PMOS device are then formed on the first and second active regions, respectively.

In accordance with another aspect of the present invention, a semiconductor substrate formed using the preferred embodiment includes a first device region and a second device region, first shallow trench isolation (STI) regions in the first device region defining a first active region in the semiconductor substrate wherein the first active region has an inherent tensile stress, second STI regions in the second device region defining a second active region in the semiconductor substrate wherein the second active region has an inherent compressive stress. The first active region is substantially greater than the second active region. The second STI regions are substantially greater than the first STI regions. The semiconductor structure further includes an NMOS device on the first active region and a PMOS device on the second active region.

The advantageous features of the preferred embodiment of the present invention include customized stresses for NMOS and PMOS devices to improve performance, requiring no extra mask, and full compatibility with the existing integrated fabrication processes.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The preferred embodiments of the present invention provide a method for forming stressors in a semiconductor substrate. The intermediate stages of manufacturing a preferred embodiment of the present invention are illustrated. Variations of the preferred embodiment are then discussed. Throughout the various views and illustrative embodiments of the present invention, like reference numbers are used to designate like elements.

Figure 1:
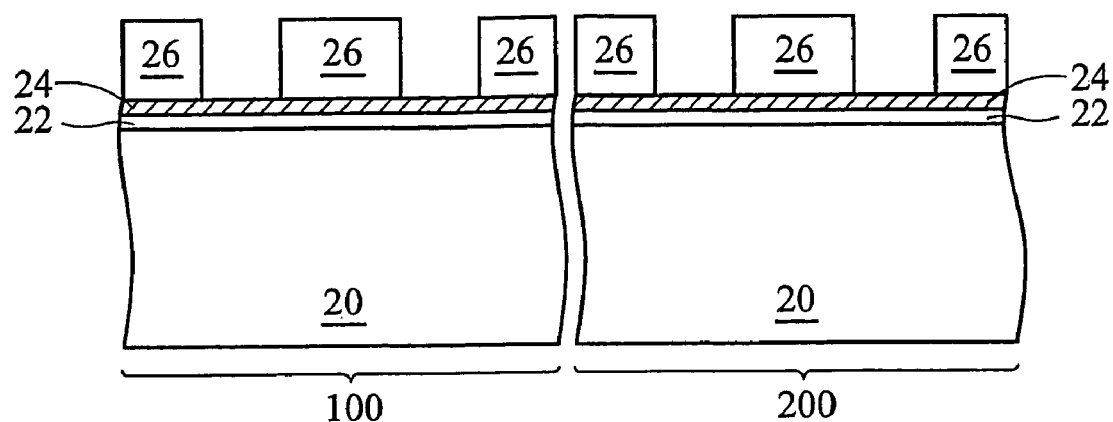
FIGS. 1 through 7 are cross-sectional views of intermediate stages in the manufacture of a preferred embodiment, wherein an insulation mask is formed before a CMP is performed.

Referring to FIG. 1, a substrate 20 is provided. In the preferred embodiment, substrate 20 is a bulk silicon substrate. In other embodiments, substrate 20 comprises silicon, germanium, carbon, and combinations thereof. In yet other embodiments, substrate 20 has a silicon-on-insulator structure. Substrate 20 includes at least two device regions 100 and 200. In the preferred embodiment, device region 100 is an NMOS device region lightly doped with a p-type dopant, and device region 200 is a PMOS device region lightly doped with an n-type dopant.

An optional pad layer 22 and a hard mask layer 24 are formed over the substrate 20. The pad layer 22 is preferably a thin oxide film formed through a thermal process, and is preferably used for reducing the stress between substrate 20 and the subsequently formed hard mask layer 24. In the preferred embodiment, hard mask layer 24 is formed of silicon nitride using low-pressure chemical vapor deposition (LPCVD). In other embodiments, hard mask layer 24 is formed of high-density plasma (HDP) nitride or plasma enhanced silicon nitride. In yet other embodiments, hard mask layer 24 is formed by thermal nitridation or plasma anodic nitridation of silicon using nitrogen. A photo resist 26 is formed and patterned over the hard mask layer 24.

Figure 2:
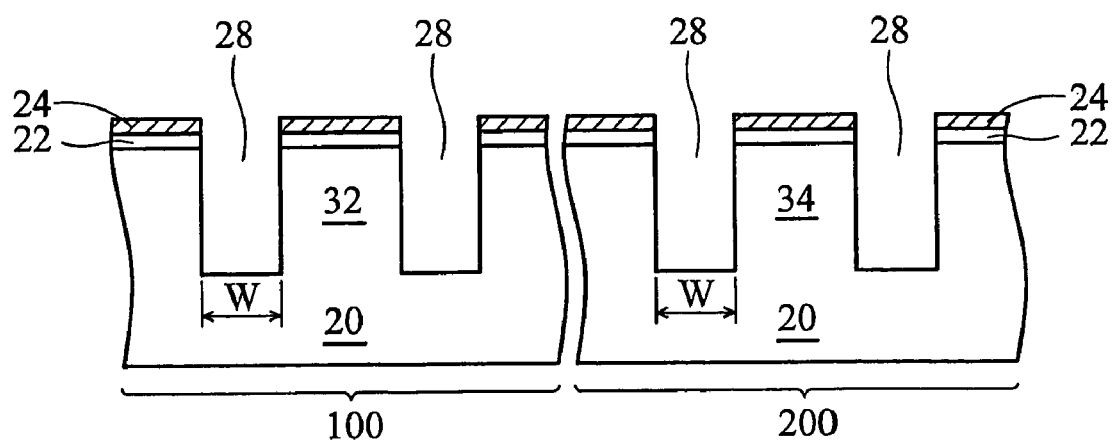

FIG. 2 illustrates the formation of trenches 28, preferably by anisotropic plasma etching using fluorine-containing chemicals. Trenches 28 define active regions 32 and 34 in device regions 100 and 200, respectively. Preferably, trenches 28 have a width W of between about 60 nm and about 150 nm. Photo resist 26 is then removed.

Figure 3:
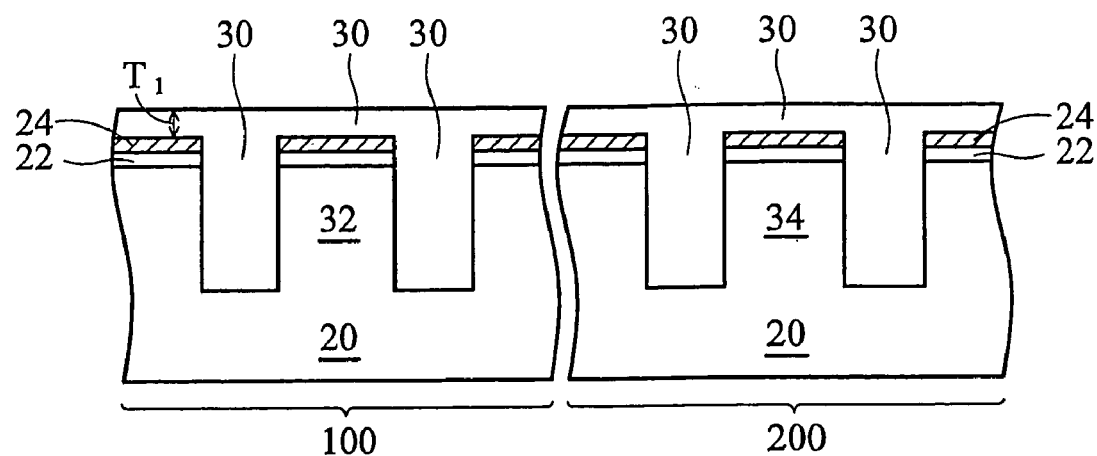

A dielectric material 30 is filled into trenches 28, as illustrated in FIG. 3. Preferably, the filling of the dielectric material 30 is performed using a high-shrinkage gap-filling process, so that the resulting dielectric material 30 has a high shrinkage rate when annealed. More preferably, the shrinkage rate is between about three percent and ten percent. The methods for forming dielectric material 30 preferably include sub-atmospheric chemical vapor deposition (SACVD), high-density plasma deposition processes such as high-density plasma CVD, spin-on. However, other commonly used methods for forming high-shrinkage dielectric materials can also be used. The process precursor may include tetra ethyl ortho silicate (TEOS), $O_3$, silane, $NH_3$, $N_2$, $H_2$, $O_2$, and combinations thereof.

The resulting dielectric material 30 preferably comprises an oxide such as silicon oxide, hafnium oxide, and the like. Dielectric material 30, as formed, preferably has an inherent stress of between about −50 MPa and about 250 MPa. The stress, however, will be changed in subsequent processes.

Figure 4:
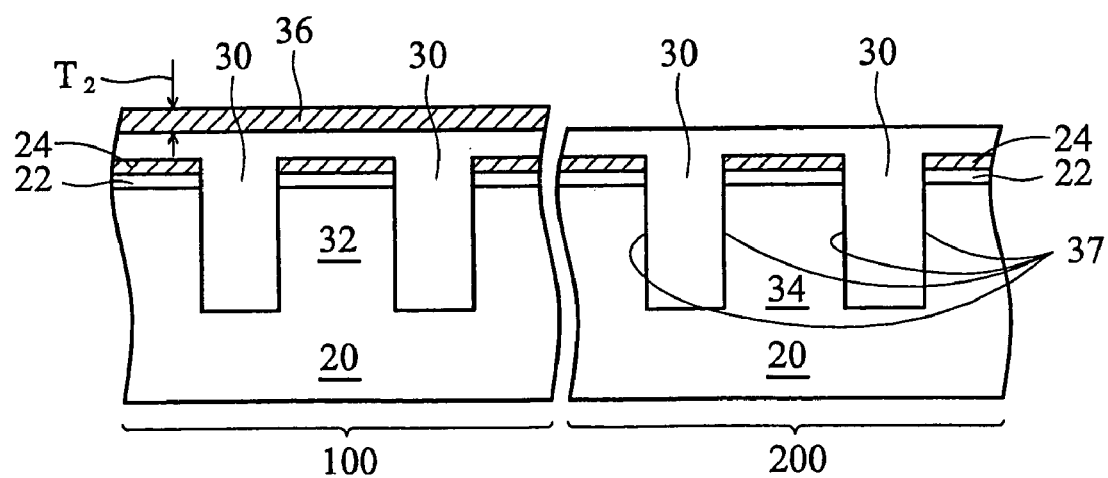

An insulation mask 36 is formed on dielectric material 30 in region 100, as shown in FIG. 4. Although insulation mask 36 is preferably formed of SiN, it may also be formed of other materials having low penetration rates for oxygen and moisture, such as SiON, and the like. In the preferred embodiment, insulation mask 36 is formed of high-density plasma (HDP) silicon nitride. Alternatively, insulation mask 36 can be formed of silicon nitride using LPCVD, or plasma enhanced silicon nitride. The preferred forming temperature is between about 300° C. and about 600° C. It is appreciated that the thickness $T_2$ is related to the insulation ability of the insulation mask 36, and a lower thickness $T_2$ is required for a material having better insulation ability. In the preferred embodiment, the thickness $T_2$ is between about 50 Å and about 800 Å. One advantageous feature of the preferred embodiments of the present invention is that insulation mask 36 may be formed using the same mask for forming n-wells (not shown), so that lower cost is involved.

A stress-tuning treatment, which includes a selective re-oxidation and a dry anneal, is then performed. In the preferred embodiment, the selective re-oxidation is performed in a gaseous environment containing $O_2$, $O_2$+$H_2$, (water) steam, and combinations thereof. Nitrogen can also be introduced to adjust the composition of the gases. Preferably, the re-oxidation is performed at a temperature of between about 600° C. and about 1100° C., and a pressure of about 10 torr to about 800 torr. The preferred methods include furnace oxidation, in-situ steam generation (ISSG), radius oxidation, and the like.

Figure 5:
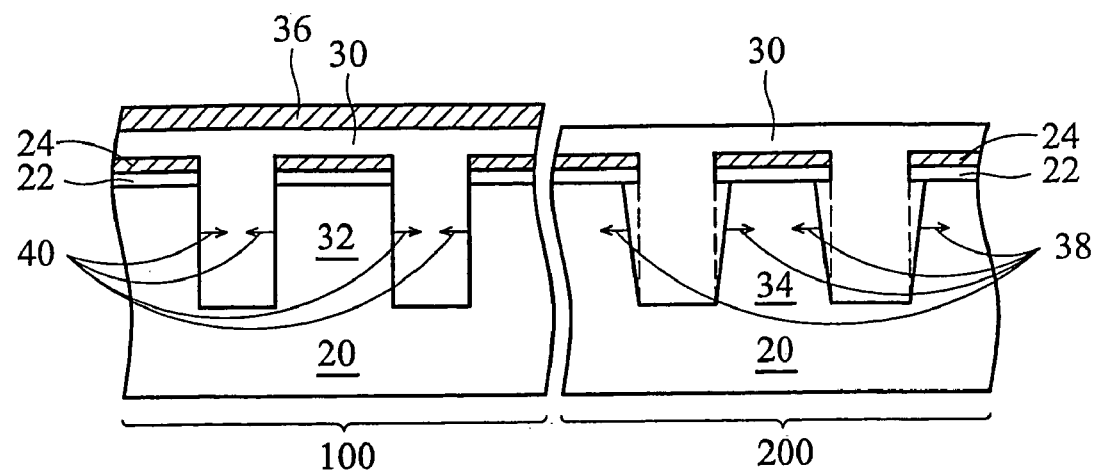

In region 100, insulation mask 36 protects underlying dielectric material 30 from being penetrated by oxygen and moisture, thus device region 100 is substantially un-oxidized. In region 200, however, oxygen and moisture penetrate dielectric material 30 and reach substrate 20. Since substrate 20 comprises semiconductor materials, preferably silicon, oxides such as silicon oxide are formed at the interfaces 37 between the active region 34 and dielectric material 30. Hard mask layer 24 protects underlying semiconductor material of substrate 20 from re-oxidation, and the major oxidation reaction occurs at the interfaces 37. Since oxygen and moisture travel down from the surface of the dielectric material 30, one possible effect is that more re-oxidation occurs in upper portions of the interfaces 37 than in lower portions. The resulting structure has a tapered active region 34, as shown in FIG. 5.

When silicon is oxidized and turned into silicon oxide, the respective volume is significantly increased. This generates a compressive stress, which is symbolized by arrows 38, to active region 34. The stress level is determined by the thickness of the newly generated oxide, and in turn depends on the re-oxidation process parameters, such as re-oxidation time, pressure, etc. In an exemplary embodiment, the re-oxidation is performed in a furnace for about three hours. One skilled in the art will realize, however, that optimal anneal time is related to the re-oxidation method and desired stress level.

A dry anneal, which is also referred to as a densification anneal, is then preformed. The dry anneal is preferably performed at a temperature of between about 900° C. and about 1100° C., and more preferably at about 1000° C. Anneal time depends on the anneal method and is preferably between about 10 minutes and about 2 hours. In an exemplary embodiment wherein furnace anneal is performed, the anneal time is about half an hour. Dry anneal and re-oxidation are preferably in-situ performed, although they can be performed in different environments and use different tools.

During the dry anneal, the high-shrinkage material 30 shrinks, preferably at a rate of between about 3 and about 10 percent. In region 100, the shrinkage of the dielectric material 30 causes its volume to decrease, thus generating forces 40 pulling the active region 32 outward. Active region 32 thus has an inherent tensile stress, and the magnitude of the tensile stress depends on the shrinkage rate of the dielectric material 30. In region 200, dielectric material 30 shrinks also, at least partially offsetting the compressive stress generated during re-oxidation. In the preferred embodiment, the overall effect is preferably a compressive stress generated in active region 34. This can be achieved by ensuring that the increased volume of the dielectric material 30 caused by re-oxidation is greater than the decreased volume caused by shrinkage. In alternative embodiments, the overall effect is that both active regions 32 and 34 have tensile stresses, with the magnitude of the stress in active region 34 smaller than in active region 32.

Figure 6:
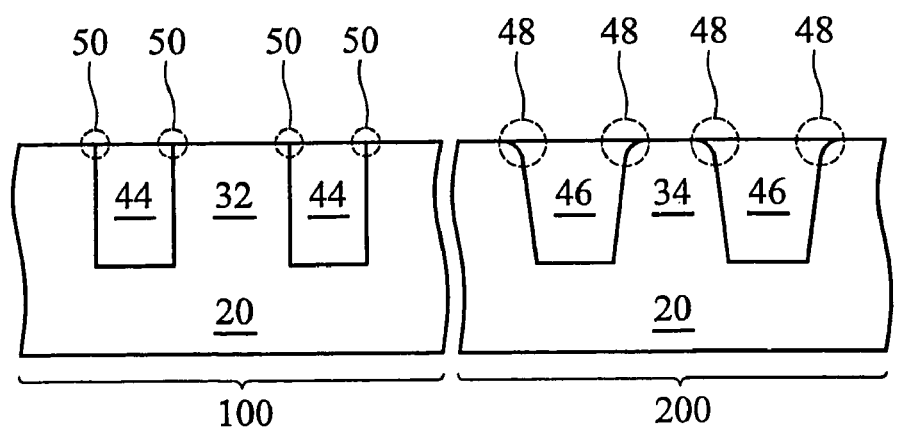

FIG. 6 illustrates the removal of insulation mask 36, excessive dielectric material 30, hard mask layer 24 and pad layer 22. Mask layer 36, which is formed of silicon nitride in the preferred embodiment, is preferably removed by etching in phosphoric acid. A chemical mechanical polish (CMP) is then performed to planarize the surface of the wafer. Remaining dielectric material 30 forms shallow trench isolation (STI) regions 44 in NMOS region 100 and STI regions 46 in PMOS region 200. Pad layer 22 and hard mask layer 24 are then removed. Preferably, hard mask layer 24 is removed by etching in phosphoric acid. Pad layer 22 is preferably stripped using diluted hydrofluoric acid.

Due to the asymmetric re-oxidation process in regions 100 and 200, STI regions 44 and 46 have different profiles, wherein STI regions 44 grow larger than STI regions 46. Possibly, the upper portions of STI regions 44 grow larger than the respective lower portions. Accordingly, active region 32 will have a greater volume than active region 34. Corner regions 48 in active region 34 will also be more rounded than the corner regions 50 in active region 32.

Figure 7:
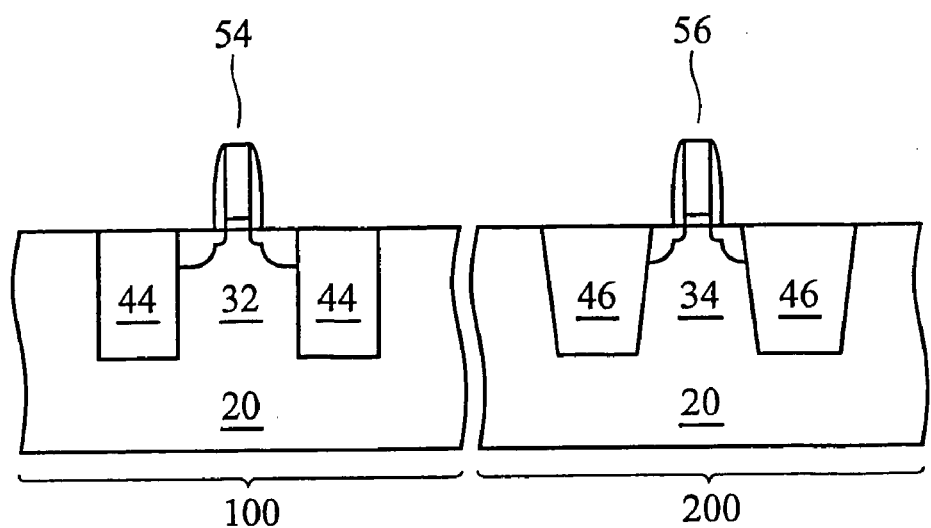

FIG. 7 illustrates the formation of an NMOS device 54 and a PMOS device 56 on active regions 32 and 34, respectively. Each of the MOS devices 54 and 56 comprises a gate dielectric, a gate electrode, spacers and source/drain regions. The formation of these components is well known in the art, and thus is not repeated herein.

In the resulting structure shown in FIG. 7, NMOS device 54 has a tensile stress in the channel length direction, while PMOS device 56 has a compressive stress in the channel length direction. Therefore, carrier mobility, hence drive currents, for both NMOS device 54 and PMOS device 56 are improved.

Figure 8:
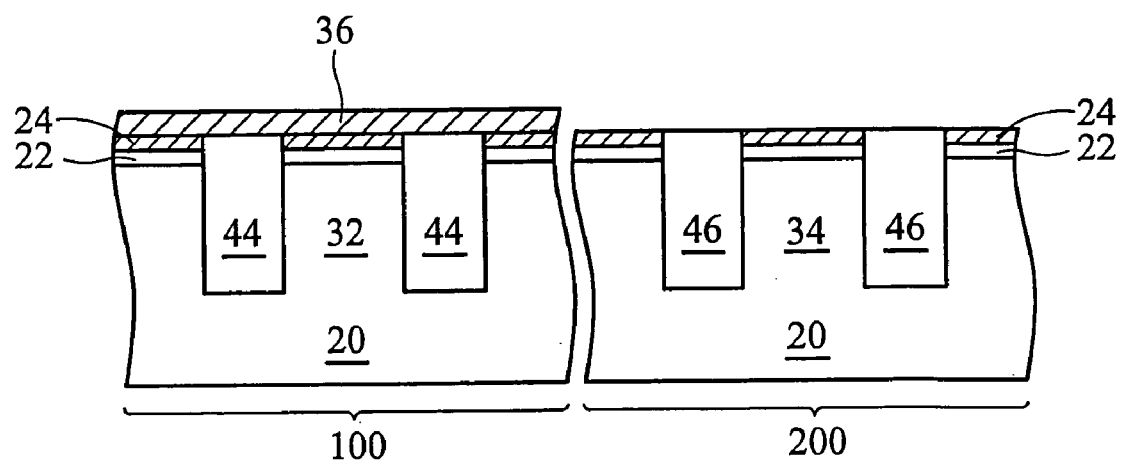
FIG. 8 illustrates an intermediate stage of a variation of the preferred embodiment, wherein an insulation mask is formed after a CMP is performed.

In the above discussed preferred embodiment, insulation mask 36 is formed before CMP is performed. In a variation of the preferred embodiment of the present invention, insulation mask 36 is formed after CMP. A cross-sectional view is shown in FIG. 8. In this embodiment, a structure as shown in FIG. 3 is formed first. A CMP is then performed, and excess dielectric material 30 above the hard mask 24 is removed, leaving STI regions 44 and 46. The insulation mask 36 is then formed over device region 100.

The stress-tuning treatment is then performed. Similar to the previously discussed embodiment, portions of the active region 34 close to the interfaces 37 are oxidized in the re-oxidation process, causing a compressive stress in active region 34. The subsequently performed dry anneal causes the shrinkage of the STI regions 44, thus a tensile stress is generated in active region 32. The stress-tuning treatment preferably uses similar process parameters as in the previously discussed embodiment with a few modifications. For example, re-oxidation time is preferably reduced. The reason is that a dielectric material 30 above the top surface of hard mask layer 24 (refer to FIG. 5), which exists in the previously discussed embodiment, is removed by CMP in this embodiment. Oxygen and moisture thus reach the interface 37 with less resistance.

Figure 9:
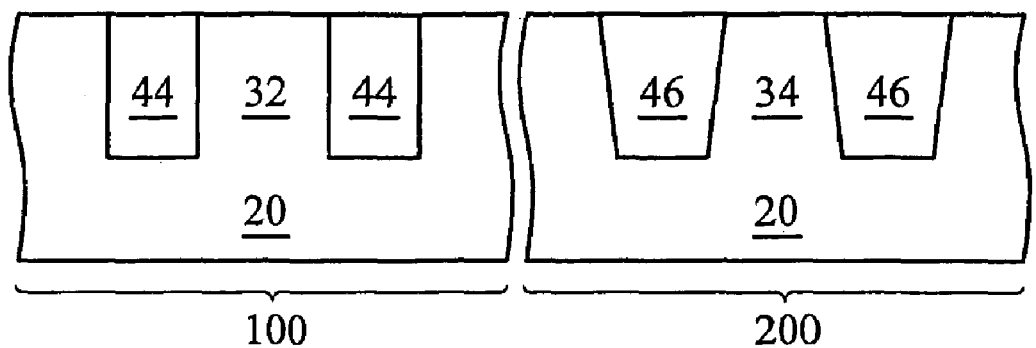
FIGS. 9 and 10 illustrate intermediate stages of a further variation of the preferred embodiment, wherein an insulation mask is formed after a hard mask layer is removed.

In a further variation of the preferred embodiment, insulation mask 36 is formed after the hard mask layer 24 is removed. In this embodiment, a structure as shown in FIG. 3 is formed first. A CMP is then performed to remove excess dielectric material 30, forming STI regions 44 and 46. Hard mask 24 and pad layer 22 are then removed. The resulting structure is shown in FIG. 9.

Figure 10:
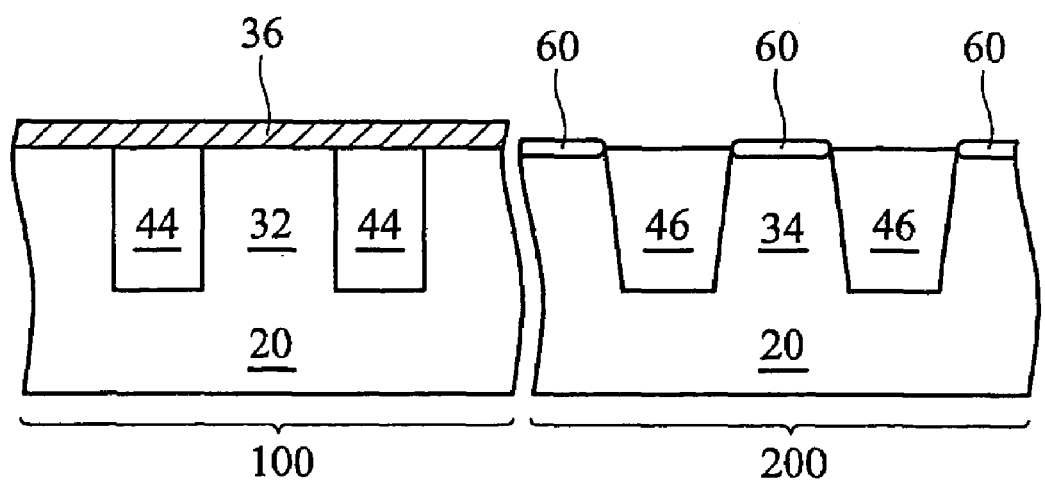

FIG. 10 illustrates the formation of the insulation mask 36 over device region 100. The stress-tuning treatment is then performed. After the re-oxidation and dry anneal, insulation mask 36 is removed. As a result of the re-oxidation, an oxide layer 60 will be formed on exposed surfaces of substrate 20, and needs to be removed before the formation of a PMOS device in active region 34. Similar to the previously discussed embodiments, tensile stress and compressive stress are generated in active regions 32 and 34, respectively.

Figure 11:
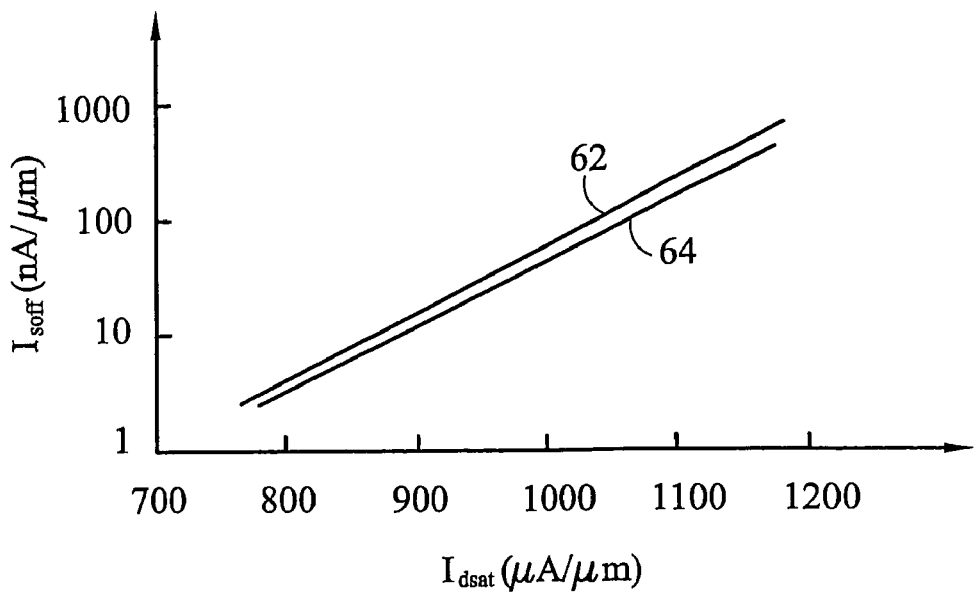
FIG. 11 illustrates $I_{off}$-$I_{on}$ characteristics of NMOS devices.

Experiment results show that the preferred embodiments of the present invention have improved device drive current over prior art. FIG. 11 illustrates $I_{on}$-$I_{off}$ characteristics of NMOS devices. Line 62 is obtained from a first sample device, which is a prior art device. Line 64 is obtained from a second sample device formed using the preferred embodiment of the present invention. The first sample device includes STI regions formed using HDPCVD, while the second sample device includes STI regions formed using SACVD and dry anneal at 1000° C. The result is similar to that of the devices masked by an insulation mask and re-oxidized at 800° C. followed by a dry anneal at 1000° C. FIG. 11 confirms the improvement of NMOS devices using the preferred embodiment of the present invention.

Figure 12:
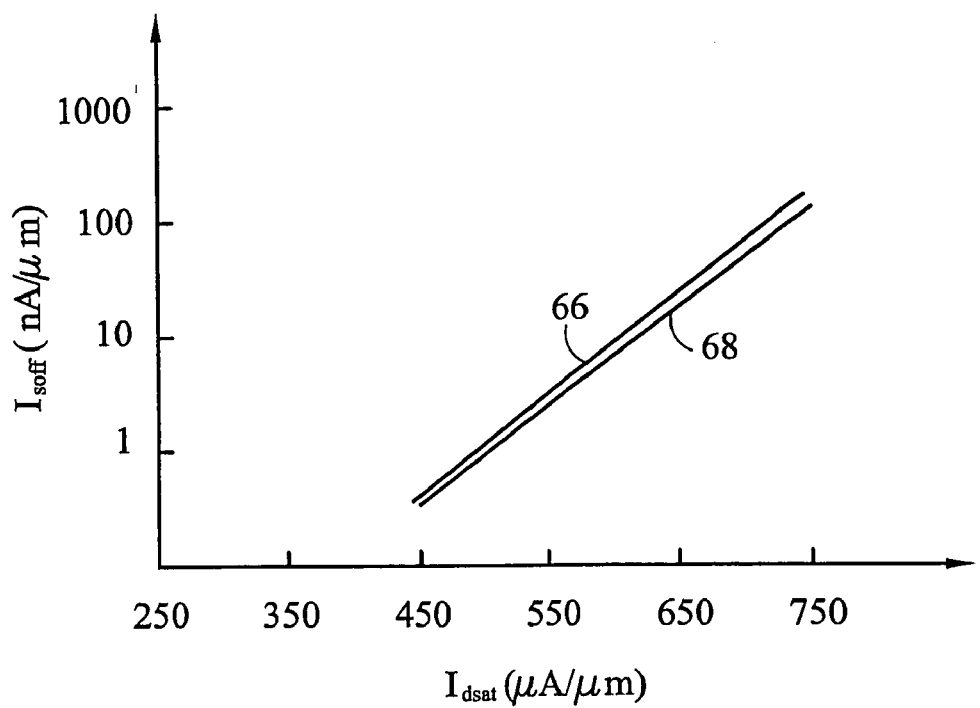
FIG. 12 illustrates $I_{off}$-$I_{on}$ characteristics of PMOS devices.

FIG. 12 illustrates $I_{on}$-$I_{off}$ characteristics of PMOS devices, wherein line 66 is obtained from a third sample device (prior art device), and line 68 is obtained from a fourth sample device formed using the preferred embodiment of the present invention. The STI regions of the third sample device are formed using HDPCVD. The fourth sample device includes STI regions formed using SACVD, and re-oxidized at about 800° C. followed by a dry anneal at about 1000° C. FIG. 12 confirms the improvement of PMOS devices using the preferred embodiment of the present invention.

The preferred embodiments of the present invention have several advantageous features. NMOS and PMOS devices on a same chip both have improved performance due to customized stressor formation. The existing (n-well) mask is used for the formation of the insulation mask, thus little extra cost is involved. The preferred embodiments of the present invention are fully compatible with existing integrated circuit fabrication processes.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for forming a semiconductor structure, the method comprising:

provided a semiconductor substrate including an NMOS device region and a PMOS device region;

forming a hard mask layer over the semiconductor substrate;

forming and patterning a photo resist over the hard mask layer;

etching the hard mask layer and the semiconductor substrate to form trenches, wherein the trenches define a first active region in the NMOS device region and a second active region in the PMOS device region;

filling the trenches with a high-shrinkage dielectric material;

performing a chemical mechanical polish (CMP) to the high-shrinkage dielectric material;

forming a mask over the high-shrinkage dielectric material in the NMOS device region, wherein the mask does not extend over the PMOS device region, and wherein the step of forming the mask is performed after the step of performing the CMP;

performing a re-oxidization to the semiconductor substrate after the step of forming the mask;

performing a densification anneal to the semiconductor substrate after the step of forming the mask, so that the high-shrinkage dielectric material substantially shrinks;

removing the mask;

performing a chemical mechanical polish (CMP); and removing the hard mask layer.

2. The method of claim 1, wherein the step of filling the trenches is performed using a method selected from the group consisting of sub-atmospheric chemical vapor deposition (SACVD) and high-density plasma chemical vapor deposition (HDPCVD)).

3. The method of claim 1, wherein the mask and the hard mask layer comprise SiN.

4. The method of claim 1, wherein the mask is formed before the step of removing the hard mask layer.

5. The method of claim 1, wherein the mask is formed after the step of removing the hard mask layer.

6. The method of claim 1 further comprising forming a pad layer on the semiconductor substrate before the step of forming the hard mask layer.

* * * * *